(12) United States Patent
Lee et al.

(10) Patent No.: US 8,654,993 B2
(45) Date of Patent: Feb. 18, 2014

(54) PORTABLE AUDIO DEVICE PROVIDING AUTOMATED CONTROL OF AUDIO VOLUME PARAMETERS FOR HEARING PROTECTION

(75) Inventors: Michael M. Lee, San Jose, CA (US); John Eric Arthur, Santa Clara, CA (US); Greg Marriott, Honolulu, HI (US)

(73) Assignee: Apple Inc., Cupertino, CA (US)

( * ) Notice: Subject to any disclaimer, the term of this patent is extended or adjusted under 35 U.S.C. 154(b) by 1331 days.

(21) Appl. No.: 11/297,032

(22) Filed: Dec. 7, 2005

(65) Prior Publication Data

US 2007/0129828 A1    Jun. 7, 2007

(51) Int. Cl.
*H03G 3/00* (2006.01)

(52) U.S. Cl.
USPC .............. 381/104; 381/72; 381/56; 700/94; 455/355; 73/646

(58) Field of Classification Search
USPC ......... 381/104, 311, 77, 105, 74, 56, 72, 107, 381/106; 455/118–122, 355, 218–222, 352; 700/94; 181/129; 73/646, 645, 579; 379/395, 387.01
See application file for complete search history.

(56) References Cited

U.S. PATENT DOCUMENTS

| | | |
|---|---|---|
| 4,090,216 A | 5/1978 | Constable |
| 4,386,345 A | 5/1983 | Narveson et al. |
| 4,451,849 A | 5/1984 | Fuhrer |
| 4,589,022 A | 5/1986 | Prince et al. |
| 4,908,523 A | 3/1990 | Snowden et al. |
| 4,928,307 A | 5/1990 | Lynn |
| 4,951,171 A | 8/1990 | Tran et al. |
| 5,046,101 A * | 9/1991 | Lovejoy .......................... 381/57 |
| 5,185,906 A | 2/1993 | Brooks |
| 5,293,494 A | 3/1994 | Saito et al. |
| 5,379,057 A | 1/1995 | Clough |
| 5,406,305 A | 4/1995 | Shimomura et al. |
| 5,559,945 A | 9/1996 | Beaudet et al. |

(Continued)

FOREIGN PATENT DOCUMENTS

| | | |
|---|---|---|
| AU | 2006249228 | 12/2006 |
| EP | 0578604 | 1/1994 |

(Continued)

OTHER PUBLICATIONS

Office Action dated Dec. 14, 2009 in U.S. Appl. No. 11/535,646.

(Continued)

*Primary Examiner* — Vivian Chin
*Assistant Examiner* — Con P Tran
(74) *Attorney, Agent, or Firm* — Blakely, Sokoloff, Taylor & Zafman LLP

(57) ABSTRACT

A method of operating a media player includes playing back audio media. During the step of playing back audio media, a maximum volume parameter is refined for the playing back of the media by the media player. The refining is based at least in part on the playing back of audio media during a time period prior to executing the maximum volume refining step. After a period of time, the maximum volume refining step is repeated. The refining is configured to prevent/minimize harm to hearing of the media player user based, for example, on the actual volume of media playback and time/duration profiles provided by occupational safety and/or other organizations.

17 Claims, 3 Drawing Sheets

(56) References Cited

U.S. PATENT DOCUMENTS

| | | | |
|---|---|---|---|
| 5,566,337 A | 10/1996 | Szymanski et al. | |
| 5,583,993 A | 12/1996 | Foster et al. | |
| 5,608,698 A | 3/1997 | Yamanoi et al. | |
| 5,616,876 A | 4/1997 | Cluts | |
| 5,617,386 A | 4/1997 | Choi | |
| 5,670,985 A | 9/1997 | Cappels, Sr. et al. | |
| 5,675,362 A | 10/1997 | Clough | |
| 5,684,513 A | 11/1997 | Decker | |
| 5,710,922 A | 1/1998 | Alley et al. | |
| 5,712,949 A | 1/1998 | Kato et al. | |
| 5,717,422 A | 2/1998 | Fergason | |
| 5,721,949 A | 2/1998 | Smith et al. | |
| 5,726,672 A | 3/1998 | Hernandez et al. | |
| 5,739,451 A | 4/1998 | Winksy et al. | |
| 5,740,143 A | 4/1998 | Suetomi | |
| 5,760,588 A | 6/1998 | Bailey | |
| 5,778,374 A | 7/1998 | Dang et al. | |
| 5,803,786 A | 9/1998 | McCormick | |
| 5,815,225 A | 9/1998 | Nelson | |
| 5,822,288 A | 10/1998 | Shinada | |
| 5,835,721 A | 11/1998 | Donahue et al. | |
| 5,835,732 A | 11/1998 | Kikinis et al. | |
| 5,838,969 A | 11/1998 | Jacklin et al. | |
| 5,864,868 A | 1/1999 | Contois | |
| 5,867,163 A | 2/1999 | Kurtenbach | |
| 5,870,710 A | 2/1999 | Ozawa et al. | |
| 5,918,303 A | 6/1999 | Yamaura et al. | |
| 5,920,728 A | 7/1999 | Hallowell et al. | |
| 5,923,757 A | 7/1999 | Hocker et al. | |
| 5,952,992 A | 9/1999 | Helms | |
| 6,006,274 A | 12/1999 | Hawkins et al. | |
| 6,009,237 A | 12/1999 | Hirabayashi et al. | |
| 6,011,585 A | 1/2000 | Anderson | |
| 6,018,705 A | 1/2000 | Gaudet et al. | |
| 6,041,023 A | 3/2000 | Lakhansingh | |
| 6,052,654 A | 4/2000 | Gaudet et al. | |
| 6,108,426 A | 8/2000 | Stortz | |
| 6,122,340 A | 9/2000 | Darley et al. | |
| 6,158,019 A | 12/2000 | Squibb | |
| 6,161,944 A | 12/2000 | Leman | |
| 6,172,948 B1 | 1/2001 | Keller et al. | |
| 6,179,432 B1 | 1/2001 | Zhang et al. | |
| 6,185,163 B1 | 2/2001 | Bickford et al. | |
| 6,191,939 B1 | 2/2001 | Burnett | |
| 6,208,044 B1 | 3/2001 | Viswanadham et al. | |
| 6,216,131 B1 | 4/2001 | Liu et al. | |
| 6,217,183 B1 | 4/2001 | Shipman | |
| 6,248,946 B1 | 6/2001 | Dwek | |
| 6,295,541 B1 | 9/2001 | Bodnar et al. | |
| 6,297,795 B1 | 10/2001 | Kato et al. | |
| 6,298,314 B1 | 10/2001 | Blackadar et al. | |
| 6,332,175 B1 | 12/2001 | Birrell et al. | |
| 6,336,365 B1 | 1/2002 | Blackadar et al. | |
| 6,336,727 B1 | 1/2002 | Kim | |
| 6,341,316 B1 | 1/2002 | Kloba et al. | |
| 6,357,147 B1 | 3/2002 | Darley et al. | |
| 6,377,530 B1 | 4/2002 | Burrows | |
| 6,452,610 B1 | 9/2002 | Reinhardt et al. | |
| 6,467,924 B2 | 10/2002 | Shipman | |
| 6,493,652 B1 | 12/2002 | Ohlenbusch et al. | |
| 6,536,139 B2 | 3/2003 | Darley et al. | |
| 6,549,497 B2 | 4/2003 | Miyamoto et al. | |
| 6,560,903 B1 | 5/2003 | Darley | |
| 6,587,403 B1 | 7/2003 | Keller et al. | |
| 6,587,404 B1 | 7/2003 | Keller et al. | |
| 6,605,038 B1 | 8/2003 | Teller et al. | |
| 6,606,281 B2 | 8/2003 | Cowgill et al. | |
| 6,611,607 B1 | 8/2003 | Davis et al. | |
| 6,611,789 B1 | 8/2003 | Darley | |
| 6,617,963 B1 | 9/2003 | Watters et al. | |
| 6,621,768 B1 | 9/2003 | Keller et al. | |
| 6,623,427 B2 | 9/2003 | Mandigo | |
| 6,631,101 B1 | 10/2003 | Chan et al. | |
| 6,693,612 B1 | 2/2004 | Matsumoto et al. | |
| 6,731,312 B2 | 5/2004 | Robbin | |
| 6,760,536 B1 | 7/2004 | Amir et al. | |
| 6,762,741 B2 | 7/2004 | Weindorf | |
| 6,781,611 B1 | 8/2004 | Richard | |
| 6,794,566 B2 | 9/2004 | Pachet | |
| 6,799,226 B1 | 9/2004 | Robbin et al. | |
| 6,801,964 B1 | 10/2004 | Mahdavi | |
| 6,826,515 B2 * | 11/2004 | Bernardi et al. | 702/191 |
| 6,832,373 B2 | 12/2004 | O'Neill | |
| 6,844,511 B1 | 1/2005 | Hsu et al. | |
| 6,870,529 B1 | 3/2005 | Davis | |
| 6,871,063 B1 | 3/2005 | Schiffer | |
| 6,876,947 B1 | 4/2005 | Darley et al. | |
| 6,882,955 B1 | 4/2005 | Ohlenbusch et al. | |
| 6,886,749 B2 | 5/2005 | Chiba et al. | |
| 6,898,550 B1 | 5/2005 | Blackadar et al. | |
| 6,911,971 B2 | 6/2005 | Suzuki et al. | |
| 6,918,677 B2 | 7/2005 | Shipman | |
| 6,931,377 B1 | 8/2005 | Seya | |
| 6,934,812 B1 | 8/2005 | Robbin et al. | |
| 6,950,087 B2 | 9/2005 | Knox et al. | |
| 7,010,365 B2 | 3/2006 | Maymudes | |
| 7,028,096 B1 | 4/2006 | Lee | |
| 7,046,230 B2 | 5/2006 | Zadesky | |
| 7,062,225 B2 | 6/2006 | White | |
| 7,072,477 B1 * | 7/2006 | Kincaid | 381/107 |
| 7,076,561 B1 | 7/2006 | Rosenberg et al. | |
| 7,084,856 B2 | 8/2006 | Huppi | |
| 7,084,921 B1 | 8/2006 | Ogawa | |
| 7,092,946 B2 | 8/2006 | Bodnar | |
| 7,124,125 B2 | 10/2006 | Cook et al. | |
| 7,131,059 B2 | 10/2006 | Obrador | |
| 7,143,241 B2 | 11/2006 | Hull | |
| 7,146,437 B2 | 12/2006 | Robbin et al. | |
| 7,151,835 B2 * | 12/2006 | Yonovitz et al. | 381/56 |
| 7,171,331 B2 | 1/2007 | Vock et al. | |
| 7,191,244 B2 | 3/2007 | Jennings et al. | |
| 7,213,228 B2 | 5/2007 | Putterman et al. | |
| 7,234,026 B2 | 6/2007 | Robbin et al. | |
| 7,277,928 B2 | 10/2007 | Lennon | |
| 7,301,857 B2 | 11/2007 | Shah et al. | |
| 7,356,679 B1 | 4/2008 | Le et al. | |
| 7,508,535 B2 | 3/2009 | Hart et al. | |
| 2001/0013983 A1 | 8/2001 | Izawa et al. | |
| 2001/0029178 A1 | 10/2001 | Criss et al. | |
| 2001/0037367 A1 | 11/2001 | Iyer | |
| 2001/0041021 A1 | 11/2001 | Boyle et al. | |
| 2001/0042107 A1 | 11/2001 | Palm | |
| 2002/0002413 A1 | 1/2002 | Tokue | |
| 2002/0013784 A1 | 1/2002 | Swanson | |
| 2002/0028683 A1 | 3/2002 | Banatre et al. | |
| 2002/0045961 A1 | 4/2002 | Gibbs et al. | |
| 2002/0046315 A1 | 4/2002 | Miller et al. | |
| 2002/0055934 A1 | 5/2002 | Lipscomb et al. | |
| 2002/0059440 A1 | 5/2002 | Hudson et al. | |
| 2002/0059499 A1 | 5/2002 | Hudson | |
| 2002/0090912 A1 | 7/2002 | Cannon et al. | |
| 2002/0116082 A1 | 8/2002 | Gudorf | |
| 2002/0116517 A1 | 8/2002 | Hudson et al. | |
| 2002/0122031 A1 | 9/2002 | Maglio et al. | |
| 2002/0123359 A1 | 9/2002 | Wei et al. | |
| 2002/0152045 A1 | 10/2002 | Dowling et al. | |
| 2002/0156833 A1 | 10/2002 | Maurya et al. | |
| 2002/0161865 A1 | 10/2002 | Nguyen | |
| 2002/0173273 A1 | 11/2002 | Spurgat et al. | |
| 2002/0189426 A1 | 12/2002 | Hirade et al. | |
| 2002/0189429 A1 | 12/2002 | Qian et al. | |
| 2002/0199043 A1 | 12/2002 | Yin | |
| 2003/0002688 A1 * | 1/2003 | Kanevsky et al. | 381/74 |
| 2003/0007001 A1 | 1/2003 | Zimmerman | |
| 2003/0018799 A1 | 1/2003 | Eyal | |
| 2003/0037254 A1 | 2/2003 | Fischer et al. | |
| 2003/0046434 A1 | 3/2003 | Flanagin et al. | |
| 2003/0050092 A1 | 3/2003 | Yun | |
| 2003/0074457 A1 | 4/2003 | Kluth | |
| 2003/0076301 A1 | 4/2003 | Tsuk et al. | |
| 2003/0076306 A1 | 4/2003 | Zadesky | |
| 2003/0079038 A1 | 4/2003 | Robbin et al. | |
| 2003/0095096 A1 | 5/2003 | Robbin et al. | |
| 2003/0097379 A1 | 5/2003 | Ireton | |

(56) References Cited

U.S. PATENT DOCUMENTS

| | | |
|---|---|---|
| 2003/0104835 A1 | 6/2003 | Douhet |
| 2003/0127307 A1 | 7/2003 | Liu et al. |
| 2003/0128192 A1 | 7/2003 | van Os |
| 2003/0133694 A1 | 7/2003 | Yeo |
| 2003/0153213 A1 | 8/2003 | Siddiqui et al. |
| 2003/0156503 A1 | 8/2003 | Schilling et al. |
| 2003/0167318 A1 | 9/2003 | Robbin et al. |
| 2003/0176935 A1 | 9/2003 | Lian et al. |
| 2003/0182100 A1 | 9/2003 | Plastina et al. |
| 2003/0221541 A1 | 12/2003 | Platt |
| 2003/0229490 A1 | 12/2003 | Etter |
| 2003/0236695 A1 | 12/2003 | Litwin, Jr. |
| 2004/0001395 A1 | 1/2004 | Keller et al. |
| 2004/0001396 A1 | 1/2004 | Keller et al. |
| 2004/0012556 A1 | 1/2004 | Yong et al. |
| 2004/0055446 A1 | 3/2004 | Robbin et al. |
| 2004/0066363 A1 | 4/2004 | Yamano et al. |
| 2004/0069122 A1 | 4/2004 | Wilson |
| 2004/0076086 A1 | 4/2004 | Keller |
| 2004/0086120 A1 | 5/2004 | Akins, III et al. |
| 2004/0094018 A1 | 5/2004 | Ueshima et al. |
| 2004/0103411 A1 | 5/2004 | Thayer |
| 2004/0125522 A1 | 7/2004 | Chiu et al. |
| 2004/0165302 A1 | 8/2004 | Lu |
| 2004/0177063 A1 | 9/2004 | Weber et al. |
| 2004/0198436 A1 | 10/2004 | Alden |
| 2004/0210628 A1 | 10/2004 | Inkinen et al. |
| 2004/0216108 A1 | 10/2004 | Robbin |
| 2004/0224638 A1 | 11/2004 | Fadell et al. |
| 2004/0242224 A1 | 12/2004 | Janik et al. |
| 2004/0246275 A1 | 12/2004 | Yoshihara et al. |
| 2004/0255135 A1 | 12/2004 | Kitaya et al. |
| 2004/0264714 A1* | 12/2004 | Lu et al. ......... 381/107 |
| 2004/0267825 A1 | 12/2004 | Novak et al. |
| 2005/0015254 A1 | 1/2005 | Beaman |
| 2005/0053365 A1 | 3/2005 | Adams et al. |
| 2005/0060240 A1 | 3/2005 | Popofsky |
| 2005/0060542 A1 | 3/2005 | Risan et al. |
| 2005/0108754 A1 | 5/2005 | Carhart et al. |
| 2005/0111820 A1 | 5/2005 | Matsumi et al. |
| 2005/0122315 A1 | 6/2005 | Chalk et al. |
| 2005/0123886 A1 | 6/2005 | Hua et al. |
| 2005/0146534 A1 | 7/2005 | Fong et al. |
| 2005/0149213 A1 | 7/2005 | Guzak et al. |
| 2005/0152294 A1 | 7/2005 | Yu et al. |
| 2005/0156047 A1 | 7/2005 | Chiba et al. |
| 2005/0160270 A1 | 7/2005 | Goldberg et al. |
| 2005/0166153 A1 | 7/2005 | Eytchison et al. |
| 2005/0216855 A1 | 9/2005 | Kopra et al. |
| 2005/0218303 A1 | 10/2005 | Poplin |
| 2005/0234983 A1 | 10/2005 | Plastina et al. |
| 2005/0244013 A1* | 11/2005 | Battenberg et al. ......... 381/57 |
| 2005/0245839 A1 | 11/2005 | Stivoric et al. |
| 2005/0246324 A1 | 11/2005 | Paalasmaa et al. |
| 2005/0248555 A1 | 11/2005 | Feng et al. |
| 2005/0257169 A1 | 11/2005 | Tu |
| 2005/0259064 A1 | 11/2005 | Sugino et al. |
| 2005/0259524 A1 | 11/2005 | Yeh |
| 2005/0270276 A1 | 12/2005 | Sugimoto et al. |
| 2006/0013414 A1 | 1/2006 | Shih |
| 2006/0025068 A1 | 2/2006 | Regan et al. |
| 2006/0026424 A1 | 2/2006 | Eto |
| 2006/0061563 A1 | 3/2006 | Fleck |
| 2006/0068760 A1 | 3/2006 | Hameed et al. |
| 2006/0071899 A1 | 4/2006 | Chang et al. |
| 2006/0088228 A1 | 4/2006 | Marriott et al. |
| 2006/0092122 A1 | 5/2006 | Yoshihara et al. |
| 2006/0094409 A1 | 5/2006 | Inselberg |
| 2006/0095502 A1 | 5/2006 | Lewis et al. |
| 2006/0098320 A1 | 5/2006 | Koga et al. |
| 2006/0135883 A1 | 6/2006 | Jonsson et al. |
| 2006/0145053 A1 | 7/2006 | Stevenson et al. |
| 2006/0152382 A1 | 7/2006 | Hiltunen |
| 2006/0155914 A1 | 7/2006 | Jobs et al. |
| 2006/0170535 A1 | 8/2006 | Watters et al. |
| 2006/0173974 A1 | 8/2006 | Tang |
| 2006/0190577 A1 | 8/2006 | Yamada |
| 2006/0190980 A1 | 8/2006 | Kikkoji et al. |
| 2006/0221057 A1 | 10/2006 | Fux et al. |
| 2006/0221788 A1 | 10/2006 | Lindahl et al. |
| 2006/0258289 A1* | 11/2006 | Dua ......... 455/41.3 |
| 2006/0259758 A1 | 11/2006 | Deng et al. |
| 2006/0265503 A1 | 11/2006 | Jones et al. |
| 2006/0272483 A1 | 12/2006 | Honeywell |
| 2006/0277336 A1 | 12/2006 | Lu et al. |
| 2007/0014536 A1 | 1/2007 | Hellman |
| 2007/0028009 A1 | 2/2007 | Robbin et al. |
| 2007/0061759 A1 | 3/2007 | Klein, Jr. |
| 2007/0089057 A1 | 4/2007 | Kindig |
| 2007/0106660 A1 | 5/2007 | Stern et al. |
| 2007/0124679 A1 | 5/2007 | Jeong et al. |
| 2007/0129062 A1 | 6/2007 | Pantalone et al. |
| 2007/0135225 A1 | 6/2007 | Nieminen et al. |
| 2007/0248311 A1 | 10/2007 | Wice et al. |
| 2007/0255163 A1 | 11/2007 | Prineppi |
| 2008/0055228 A1 | 3/2008 | Glen |
| 2010/0077338 A1 | 3/2010 | Matthews et al. |

FOREIGN PATENT DOCUMENTS

| | | |
|---|---|---|
| EP | 0578604 A1 | 1/1994 |
| EP | 0 757 437 | 2/1997 |
| EP | 0 813 138 | 12/1997 |
| EP | 0 863 469 | 9/1998 |
| EP | 0 917 077 | 5/1999 |
| EP | 0 982 732 | 3/2000 |
| EP | 1 028 425 | 8/2000 |
| EP | 1028426 A2 | 8/2000 |
| EP | 1 076 302 | 2/2001 |
| EP | 1 213 643 | 6/2002 |
| EP | 1 289 197 | 3/2003 |
| EP | 1 503 363 | 2/2005 |
| EP | 1536612 | 6/2005 |
| EP | 1 566 743 | 8/2005 |
| EP | 1566948 | 8/2005 |
| EP | 1 372 133 | 12/2005 |
| EP | 1 686 496 | 8/2006 |
| GB | 2 370 208 | 6/2002 |
| GB | 2384399 | 7/2003 |
| GB | 2399639 | 5/2005 |
| JP | 59-023610 | 2/1984 |
| JP | 03-228490 | 10/1991 |
| JP | 04-243386 | 8/1992 |
| JP | 6-96520 | 4/1994 |
| JP | 8-235774 | 9/1996 |
| JP | 9-50676 | 2/1997 |
| JP | 9-259532 | 10/1997 |
| JP | 2000-90651 | 3/2000 |
| JP | 2000-224099 | 8/2000 |
| JP | 2000-285643 | 10/2000 |
| JP | 2000-299834 | 10/2000 |
| JP | 2000-311352 | 11/2000 |
| JP | 2000-339864 | 12/2000 |
| JP | 2001-236286 | 8/2001 |
| JP | 2001-312338 | 11/2001 |
| JP | 2002-076977 | 3/2002 |
| JP | 2002-175467 | 6/2002 |
| JP | 2003-188792 | 7/2003 |
| JP | 2003-259333 | 9/2003 |
| JP | 2003-319365 | 11/2003 |
| JP | 2004-021720 | 1/2004 |
| JP | 2004-219731 | 8/2004 |
| JP | 2004-220420 | 8/2004 |
| KR | 20010076508 | 8/2001 |
| WO | WO 95/16950 | 6/1995 |
| WO | 98/17032 | 4/1998 |
| WO | WO 99/28813 | 6/1999 |
| WO | WO 00/22820 | 4/2000 |
| WO | WO 01/33569 | 5/2001 |
| WO | WO 01/65413 | 9/2001 |
| WO | WO 01/67753 | 9/2001 |
| WO | WO 02/25610 | 3/2002 |
| WO | WO 03/023786 | 3/2003 |
| WO | WO 03/036457 | 5/2003 |

(56) References Cited

FOREIGN PATENT DOCUMENTS

| WO | WO 03/067202 | 8/2003 |
|---|---|---|
| WO | WO 03/067202 A2 | 8/2003 |
| WO | 2004/061850 A1 | 7/2004 |
| WO | WO 2004/055637 | 7/2004 |
| WO | WO2004/084413 A2 | 9/2004 |
| WO | WO 2004/104815 | 12/2004 |
| WO | WO 2005/031737 | 4/2005 |
| WO | 2005/048644 | 5/2005 |
| WO | WO 2005/008505 | 7/2005 |
| WO | 2005/109781 | 11/2005 |
| WO | WO 2006/040737 | 4/2006 |
| WO | 2006/071364 | 6/2006 |

OTHER PUBLICATIONS

Office Action dated Sep. 3, 2009 in U.S. Appl. No. 11/324,863.
Office Action dated Jun. 24, 2009 in U.S. Appl. No. 11/373,468.
Office Action dated May 27, 2009 in U.S. Appl. No. 11/439,613.
Office Action dated Jun. 2, 2009 in U.S. Appl. No. 11/530,773.
Office Action dated May 11, 2009 in U.S. Appl. No. 11/680,580.
Notice of Allowance dated Apr. 21, 2009 in U.S. Appl. No. 11/327,544.
Office Action dated Mar. 30, 2009 in U.S. Appl. No. 11/515,270.
Office Action dated Apr. 9, 2009 in U.S. Appl. No. 11/583,199.
Notice of Allowance dated Jun. 15, 2009 in U.S. Appl. No. 11/212,313.
Office Action dated Jun. 22, 2009 in U.S. Appl. No. 11/515,270.
Office Action dated Jun. 24, 2009 in U.S. Appl. No. 11/519,352.
Office Action dated Sep. 10, 2009 in U.S. Appl. No. 11/746,548.
Office Action dated Sep. 2, 2009 in U.S. Appl. No. 11/515,270.
Office Action dated Oct. 16, 2009 in U.S. Appl. No. 11/583,199.
Office Action dated Oct. 23, 2009 in Chinese Application No. 200580048143.9.
Office Action dated Nov. 16, 2009 in U.S. Appl. No. 11/439,613.
Office Action dated Nov. 16, 2009 in U.S. Appl. No. 11/144,541.
Office Action dated May 29, 2009 in EP Application No. 06 847 856.9.
Office Action dated Dec. 11, 2009 in U.S. Appl. No. 11/519,352.
Office Action dated Dec. 16, 2009 in U.S. Appl. No. 11/746,548.
Examination Report dated Sep. 1, 2009 in Singapore Application No. 200701865-8.
Office Action dated Sep. 25, 2009 in Chinese Application No. 200610130904.1.
Office Action in European Patent Application No. 05 855 368.6 dated Nov. 20, 2008.
Office Action dated Dec. 15, 2008 in U.S. Appl. No. 11/212,313.
Notice of Allowance dated Dec. 18, 2008 in U.S. Appl. No. 11/212,555.
International Search Report dated Oct. 10, 2008 in PCT Application No. PCT/US2007/077160.
Written Opinion dated Oct. 10, 2008 in PCT Application No. PCT/US2007/077160.
Office Action dated Jan. 26, 2009 in U.S. Appl. No. 11/373,468.
Office Action dated Sep. 1, 2008 in EP Application No. 06 256 215.2.
Written Opinion dated Jan. 6, 2009 in Singapore Application No. 0701865-8.
Apple iTunes Smart Playlists, downloaded Apr. 5, 2005 from http://web.archive.org/web/20031002011316/www.apple.com/itunes/smartplaylists . . . pp. 1-2.
International Search Report dated Dec. 5, 2007 in Patent Application No. PCT/US2007/004810.
International Search Report dated Jan. 29, 2008 in Patent Application No. PCT/US2006/048738.
International Search Report in Patent Application No. PCT/US2007/077020 dated Jan. 28, 2008.
International Search Report in Patent Application No. PCT/US2007/076889 dated Jan. 28, 2008.
iTunes, Wikipedia: The Free Encyclopedia; downloaded on Oct. 5, 2005, pp. 1-6.
Nutzel et al., "Sharing Systems for Future HiFi Systems", The Computer Society, Jun. 2004.
Partial Search Report dated Sep. 6, 2007 in Patent Application No. PCT/US2007/004810.
Written Opinion dated Dec. 5, 2007 in PCT Application No. PCt/US2007/004810.
Written Opinion in Patent Application No. PCT/US2006/048738 dated Jan. 29, 2008.
Written Opinion in Patent Application No. PCT/US2007/076889 dated Jan. 28, 2008.
Written Opinion in Patent Application No. PCT/US2007/077020 dated Jan. 28, 2008.
Office Action dated Feb. 1, 2008 in U.S. Appl. No. 11/327,544.
Hart-Daves, Guy, "How to Do Everything with Your iPod and iPod Mini", 2004, McGraw-Hill Professional, p. 33.
Office Action dated Feb. 4, 2008 in U.S. Appl. No. 11/566,072.
International Search Report dated Feb. 18, 2008 in Patent Application No. PCT/US2007/079766.
International Search Report Dated Sep. 27, 2007 in Application No. 05824296.7.
Office Action dated Apr. 4, 2008 in U.S. Appl. No. 11/212,555.
Office Action dated Feb. 20, 2008 in Japanese Application No. 2007-538196.
Office Action dated Mar. 4, 2008 from U.S. Appl. No. 10/973,657.
Partial International Search Report dated Feb. 1, 2008 in Patent Application No. PCT/US2007/010630.
Written Opinion dated Feb. 18, 2008 in Patent Application No. PCT/US2007/079766.
Search Report dated Mar. 20, 2008 in Patent Application No. PCT/US2007/077789.
Written Opinion dated Mar. 20, 2008 in Patent Application No. PCT/US2007/077789.
Invitation to Pay Additional Fees and Partial Search Report for PCT Application No. PCT/US2007/077160 dated Apr. 1, 2008.
"Combination Belt Clip Leaf Spring and Housing Latch", Wandt et al.; Motorola Technical Developments, Motorla Inc. Schaumburg, IL. vol. 18, Mar. 1, 1993.
Notification of Reason for Rejection from PCT Application No. 2003-539048 dated Nov. 27, 2007.
International Search Report in corresponding European Application No. 06256215.2 dated Feb. 20, 2007.
"Creative Zen Vision: M 30GB", Dec. 21, 2005; downloaded on Jan. 11, 2008 from http://web.archive.org/web/20051221050140/http://www.everthingusb.com/creative_zen_vision:m_30gb.html>.
International Search Report dated Jul. 7, 2008 in PCT Application No. PCT/US2007/076793.
International Search Report dated Jun. 10, 2008 in PCT Application No. PCT/US2007/010630.
Office Action dated Jun. 17, 2008 in U.S. Appl. No. 11/212,313.
Office Action dated May 30, 2008 in Chinese Patent Application No. 02825938.6.
Office Action in Japanese Patent Application No. 2008-045351 dated Aug. 5, 2008.
Office Action in U.S. Appl. No. 11/212,555 dated Aug. 14, 2008.
Search Report dated May 15, 2008 in PCT Application No. PCT/US2007/019578.
Written Opinion dated Jul. 7, 2008 in PCT Application No. PCT/US2007/076793.
Written Opinion dated Jun. 10, 2008 in PCT Application No. PCT/US2007/010630.
Written Opinion dated May 15, 2008 in PCT Application No. PCT/US2007/019578.
Yee et al., "Faceted Metadata for Image Search and Browsing." Association For Computing Machinery, Conference Proceedings, Apr. 5, 2003.
Office Action dated Oct. 16, 2008 in U.S. Appl. No. 11/327,544.
Kadir et al., "Adaptive Fast Playback-Based Video Skimming Using a Compressed-Domain Visual Complexity Measure", 2004 IEEE International Conference on Multimedia and Expo, pp. 2055-2058.
"Apple Announces iTunes 2," Press Release, Apple Computer, Inc., Oct. 23, 2001.
"Apple Introduces iTunes / World's Best and Easiest To Use Jukebox Software," Macworld Expo, San Francisco, Jan. 9, 2001.

(56) References Cited

OTHER PUBLICATIONS

"Apple's iPod Available in Stores Tomorrow," Press Release, Apple Computer, Inc., Nov. 9, 2001.
"Nomad Jukebox," User Guide, Creative Technology Ltd., Version 1, Aug. 2000.
"SoundJam MP Plus Manual, version 2.0" / MP3 Player and Encoder for Macintosh by Jeffrey Robbin, Bill Kincaid and Dave Heller, manual by Tom Negrino, published by Casady & Greene, Inc., 2000.
"12.1" 925 Candela Mobile PC", downloaded from LCDHardware.com on Dec. 19, 2002, http://www.lcdharware.com/panel/12_1_panel/default.asp.
"BL82 Series Backlit Keyboards", www.tg3electronics.com/products/backlit/backlit.htm, downloaded Dec. 19, 2002.
"Bluetooth PC Headsets—Enjoy Wireless VoIP Conversations: 'Connecting' Your Bluetooth Headset With Your Computer", Bluetooth PC Headsets; downloaded on Apr. 29, 2006 from http://www.bluetoothpcheadsets.com/connect.htm.
"Creative MuVo TX 256 MB," T3 Magazine, Aug. 17, 2004, http://www.t3.co.uk/reviews/entertainment/mp3_player/creative_muvo_tx_256mb [downloaded Jun. 6, 2006].
"Digital Still Cameras—Downloading Images to a Computer," Mimi Chakarova et al., Multi/Media Reporting and Convergence, 2 pgs.
"Eluminx Illuminated Keyboard", downloaded Dec. 19, 2002, http://www.elumix.com/.
"How To Pair a Bluetooth Headset & Cell Phone", About.com; downloaded on Apr. 29, 2006 from http://mobileoffice.about.com/od/usingyourphone/ht/blueheadset_p.htm.
"Peripherals for Industrial Keyboards & Pointing Devices", Stealth Computer Corporation, downloaded on Dec. 19, 2002, http://www.stealthcomputer.com/peropherals_oem.htm.
"Poly/Optical Fiber Optic Membrane Switch Backlighting", downloaded Dec. 19, 2002, http://www.poly/optical.com/membrane_switches.html.
"Public Safety Technologies Tracer 2000 Computer", downloaded Dec. 19, 2002, http://www.pst911.com/traver.html.
"QuickTime Movie Playback Programming Guide", Apple Computer, Inc., Aug. 11, 2005.
"QuickTime Overview", Apple Computer, Inc., Aug. 11, 2005.
"Rocky Matrix Backlit Keyboard", downloaded Dec. 19, 2002, http://www.amrel.com/asi_matrixkeyboard.html.
"Sony Ericsson to introduce Auto pairing to improve Bluetooth connectivity between headsets and phones", Sep. 28, 2005 Press Release, Sony Ericsson Corporate; downloaded on Apr. 29, 2006 from http://www.sonyericsson.com/spg.jsp?cc=global&lc=en&ver=4001&template=pc3_1_1&z . . . .
"TAOS, Inc., Announces Industry's First Ambient Light Sensor to Convert Light Intensity to Digital Signals", www.taosinc.com/pressrelease_090902.htm, downloaded Jan. 23, 2003.
"Toughbook 28: Powerful, Rugged and Wireless", Panasonic: Toughbook Models, downloaded Dec. 19, 2002, http:www.panasonic.com/computer/notebook/html/01a_s8.htm.
"When it Comes to Selecting a Projection TV, Toshiba Makes Everything Perfectly Clear, Previews of New Releases", www.bestbuy.com/HomeAudioVideo/Specials/ToshibaTVFeatures.asp, downloaded Jan. 23, 2003.
"WhyBuy: Think Pad", IBM ThinkPad Web Page Ease of Use, downloaded on Dec. 19, 2002, http://www.pc.ibm.com/us/thinkpad/easeofuse.html.
512MB Waterproof MP3 Player with FM Radio & Built/in Pedometer, Oregon Scientific, downloaded on Jul. 31, 2006 from http://www2.oregonscientific.com/shop/product.asp?cid=4&scid=11&pid=581.
Adam C. Engst, "SoundJam Keeps on Jammin'," Jun. 19, 2000, http://db.tidbits.com/getbits.acgi?tbart=05988.
Alex Veiga, "AT&T Wireless Launching Music Service," Yahoo! Finance, Oct. 5, 2004, pp. 1/2.
Andrew Birrell, "Personal Jukebox (PJB)," Oct. 13, 2000, http://birrell.org/andrew/talks/pjb/overview.ppt.
Apple iPod Technical Specifications, iPod 20GB and 60GB Mac + PC, downloaded from http://www.apple.com/ipod/color/specs.html on Aug. 8, 2005.
Bociurkiw, Michael, "Product Guide: Vanessa Matz,", www.forbes.com/asap/2000/1127/vmartz_print.html, Nov. 27, 2000.
Compaq, "Personal Jukebox," Jan. 24, 2001, http://research.compaq.com/SRC/pjb/.
CREATIVE: "Creative NOMAD MuVo TX," www.creative.com, Nov. 1, 2004, http://web.archive.org/web/20041024175952/www.creative.com/products/pfriendly.asp?product=9672 [downloaded Jun. 6, 2006].
CREATIVE: "Creative NOMAD MuVo," www.creative.com, Nov. 1, 2004, http://web.archive.org/web/20041024075901/www.creative.com/products/product.asp?category=213&subcategory=215&product=110 [downloaded Jun. 7, 2006].
CREATIVE: "MP3 Player," www.creative.com, Nov. 1, 2004, http://web.archive.org/web/20041024074823/www.creative.com/products/product.asp?category=213&subcategory=216&product=4983 [downloaded Jun. 7, 2006].
De Herrera, Chris, "Microsoft ActiveSync 3.1," Version 1.02, Oct. 13, 2000.
iAP Sports Lingo 0x09 Protocol V1.00, May 1, 2006.
IEEE 1394—Wikipedia, 1995, http://www.wikipedia.org/wiki/Firewire.
Written Opinion of the International Searching Authority dated Nov. 24, 2006 in PCT Application No. PCT/US2005/046797.
International Search Report dated Feb. 4, 2003 in corresponding application No. PCT/US2002/033330.
International Search Report dated Jul. 10, 2007 in corresponding application No. PCT/US2006/048738.
International Search Report dated Apr. 5, 2006 from corresponding International Application No. PCT/US2005/038819.
International Search Report dated Jul. 2, 2007 in related case PCT/US2006/048669.
International Search Report dated Jun. 19, 2007 in related Application PCT/US2006/048753.
International Search Report dated May 21, 2007 from corresponding PCT Application No. PCT/US2006/048670.
Invitation to Pay Additional Fees and Partial Search Report for corresponding PCT Application No. PCT/US2005/046797 dated Jul. 3, 2006.
iTunes 2, Playlist Related Help Screens, iTunes v2.0, Apple Computer, Inc., Oct. 23, 2001.
iTunes, Playlist Related Help Screens, iTunes v1.0, Apple Computer, Inc., Jan. 2001.
Jabra Bluetooth Headset User Manual; GN Netcom A/s, 2005.
Jabra Bluetooth Introduction; GN Netcom A/S, Oct. 2004.
Jabra FreeSpeak BT200 User Manual; Jabra Corporation, 2002.
Kennedy, "Digital Data Storage Using Video Disc," IBM Technical Disclosure Bulletin, vol. 24, No. 2, Jul. 1981.
Miniman, "Applian Software's Replay Radio and Player v1.02," Product review, pocketnow.com, http://www.pocketnow.com/reviews/replay/replay.htm, Jul. 31, 2001.
Musicmatch, "Musicmatch and Xing Technology Introduce Musicmatch Jukebox," May 18, 1998, http://www.musicmatch.com/info/company/press/releases/?year=1998&release=2.
International Search Report dated Nov. 24, 2006 in PCT Application No. PCT/US2005/046797.
Personal Jukebox (PJB), "Systems Research Center and PAAD," Compaq Computer Corp., Oct. 13, 2000, http://research.compaq.com/SRC/pjb/.
Peter Lewis, "Two New Ways to Buy Your Bits," CNN Money, Dec. 31, 2003, pp. 1/4.
Sastry, Ravindra Wadali. "A Need for Speed: A New Speedometer for Runners", submitted to the Department of Electrical Engineering and Computer Science at the Massachusetts Institute of Technology, May 28, 1999.
Sinitsyn, Alexander. "A Synchronization Framework for Personal Mobile Servers," Pervasice Computing and Communications Workshops, 2004. Proceedings of the Second IEEE Annual Conference on, Piscataway, NJ, USA, IEEE, Mar. 14, 2004, pp. 208/212.
SoundJam MP Plus, Representative Screens, published by Casady & Greene, Inc., Salinas, CA, 2000.

(56) References Cited

OTHER PUBLICATIONS

Specification Sheet, iTunes 2, Apple Computer, Inc., Oct. 31, 2001.
Spiller, Karen. "Low/decibel earbuds keep noise at a reasonable level", The Telegraph Online, dated Aug. 13, 2006, http://www.nashuatelegraph.com/apps/pbcs.dll/article?Date=20060813&Cate . . . Downloaded Aug. 16, 2006.
Steinberg, "Sonicblue Rio Car," Product Review, Dec. 12, 2000, http://electronics.cnet.com/electronics/0/6342420/1304/4098389.html.
Travis Butler, "Archos Jukebox 6000 Challenges Nomad Jukebox," Aug. 13, 2001, http://db.tidbits.com/getbits.acgi?tbart=06521.
Travis Butler, "Portable MP3: The Nomad Jukebox," Jan. 8, 2001, http://db.tidbits.com/getbits.acgi?tbart=06261.
Waterproof Music Player with FM Radio and Pedometer User Manual, Oregon Scientific, 2005.
Office Action dated Apr. 15, 2010 in U.S. Appl. No. 11/373,468.
Office Action dated Mar. 11, 2010 in U.S. Appl. No. 11/830,746.
Office Action dated Mar. 24, 2010 in U.S. Appl. No. 11/583,199.
Office Action dated Mar. 10, 2010 in U.S. Appl. No. 11/583,327.
Office Action dated Feb. 3, 2010 in U.S. Appl. No. 11/439,613.
Notice of Allowance dated Feb. 4, 2010 in U.S. Appl. No. 11/535,646.
Office Action dated Mar. 9, 2010 in U.S. Appl. No. 11/519,352.
Office Action dated Mar. 4, 2010 in U.S. Appl. No. 11/324,863.
Office Action dated Apr. 12, 2010 in U.S. Appl. No. 12/397,051.
Office Action dated Apr. 13, 2010 in U.S. Appl. No. 12/406,793.
European Office Action dated Feb. 1, 2010 from EP Patent Application No. 06 256 215.2.
Notice of Acceptance dated Mar. 17, 2010, for Australian Patent Application No. 2006249228.
Second Office Action dated Jun. 24, 2010, for Chinese Patent Application No. 200610130904.1.
Third Office Action dated Feb. 9, 2011, for Chinese Patent Application No. 200610130904.1.
Extended European Search Report dated Apr. 23, 2012 in European Patent Application No. 10182777.2.
Examiner's Report mailed Mar. 28, 2012 in Canadian Patent Application No. 2,570,100.

\* cited by examiner

| Headphone type | Compensation factor |
|---|---|
| A | $C_A$ |
| B | $C_B$ |
| C | $C_C$ |
| D | $C_D$ |
| E | $C_E$ |
| F | $C_F$ |

| Song | Song Characteristics |
|---|---|
| A | $L_A$ |
| B | $L_B$ |
| C | $L_C$ |
| D | $L_D$ |
| E | $L_E$ |

PORTABLE AUDIO DEVICE PROVIDING AUTOMATED CONTROL OF AUDIO VOLUME PARAMETERS FOR HEARING PROTECTION

BACKGROUND

Portable media players are becoming pervasive, particularly among relatively younger people. An unintended side effect of using such players is the damaging effect on the users' hearing. The damaging effect on the users' hearing may be exacerbated by new manners of use (all day use, versus for limited time periods such as during jogging) and, perhaps, by the configuration of the headphones (in the ear).

Furthermore, since the damaging effect on users' hearing is both gradual and cumulative, even those users who are concerned about hearing loss may not behave with respect to their portable media players in a manner that would limit or minimize such damaging hearing effects.

SUMMARY

A method of operating a media player includes playing back audio media. During the step of playing back audio media, a maximum volume parameter is refined for the playing back of the media by the media player. The refining is based at least in part on the playing back of audio media during a time period prior to executing the maximum volume refining step. After a period of time, the maximum volume refining step is repeated.

The refining is configured to prevent/minimize harm to hearing of the media player user based, for example, on the actual volume of media playback and time/duration profiles provided by occupational safety and/or other organizations.

BRIEF DESCRIPTION OF THE DRAWINGS

FIG. 3 illustrates a table of compensation factors, based on headphone type, employed in refining the maximum volume value.

FIG. 4 illustrates a table of compensation factors, based on song characteristics, employed in refining the maximum volume value.

DETAILED DESCRIPTION

In accordance with a broad aspect, a portable media player processes protection parameters to control the playback of media by the portable media player. During use of the portable media player and based on actual use of the portable media player, the protection parameters are adjusted. Thus, for example, the adjustment of the protection parameters may take into account volume of playback in actual use, including duration of playback.

In one example, a "credit" accounting is maintained for determining the protection parameters, where credits are subtracted based on actual use that has first particular characteristics, whereas credits are added based on actual use that has second particular characteristics. For example, the first particular characteristics may be characteristics for which it has been determined to have a relatively damaging cumulative effect on hearing (e.g., relatively "loud" playback), whereas the second particular characteristics may be characteristics for which it has been determined to not have a relatively damaging cumulative effect on hearing (e.g., relatively "soft" playback, that allows recovery from the relatively damaging cumulative effect on hearing).

Figure 1:
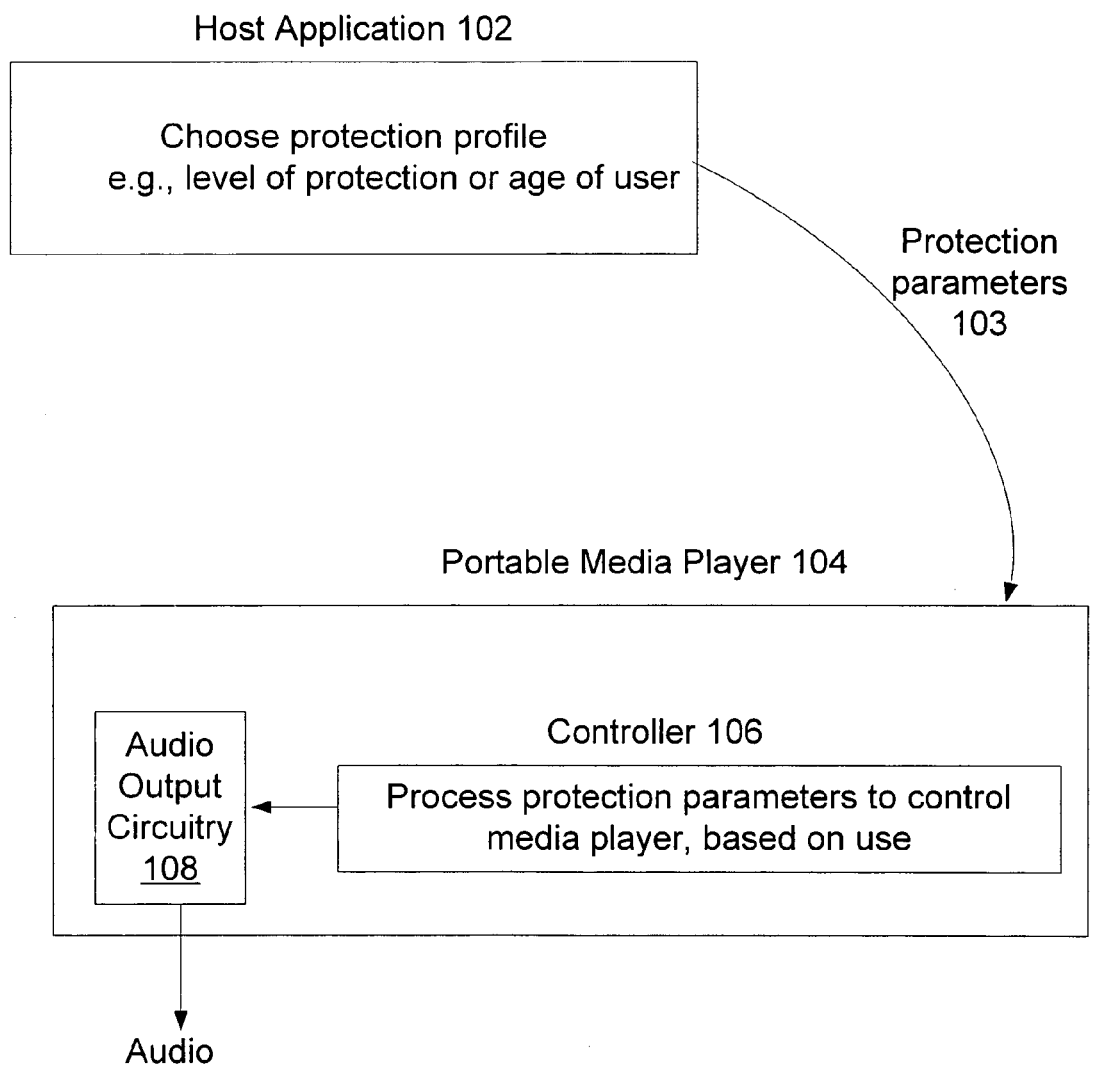
FIG. 1 illustrates a host application in detachable communication with a portable media player, including communication of an indication of protection parameters from the host application to the portable media player.

FIG. 1 broadly illustrates one example of an architecture that uses protection parameters. As shown in FIG. 1, a host application 102 executing on a computer interfaces with a portable media player 104. The host application 102 may be, for example, the iTunes® software provided by Apple Computer, Inc. In one example, a user (e.g., a parent of the user of the portable media player 104) interacts with the host application 102 to choose a protection profile. The protection profile may be based, for example, on a desired level of protection (such as "low," "medium" and "high") or on an age of the user (e.g., assuming that a younger user requires more constraints).

As also shown in FIG. 1, an indication of protection parameters is provided from the host application 102 to the portable media player 104. The protection parameters may be pre-stored on the portable media player 104, with a signal being provided to from the host application 102 to the portable media player 104 that indicates which protection parameters to use. In other examples, a user of the portable media player 104 interacts directly with the portable media player 104 to cause the protection parameters to be indicated. Indication of the protection parameters may also be a result of interaction with both the host application 102 and the portable media player 104.

In the portable media player 104, a controller 106 processes the protection parameters to determine threshold playback characteristics, such as maximum playback volume or characteristics that are an indication of (and/or contribute to) the maximum playback volume. The actual playback by the portable media player, by audio output circuitry 108, is thus constrained by the determined threshold playback characteristics. Moreover, the threshold playback characteristics are adjusted by the controller based on characteristics of the actual playback operation of the portable media player 104. In some examples, the threshold playback characteristics are determined on the host, by the host application 102.

Figure 2:
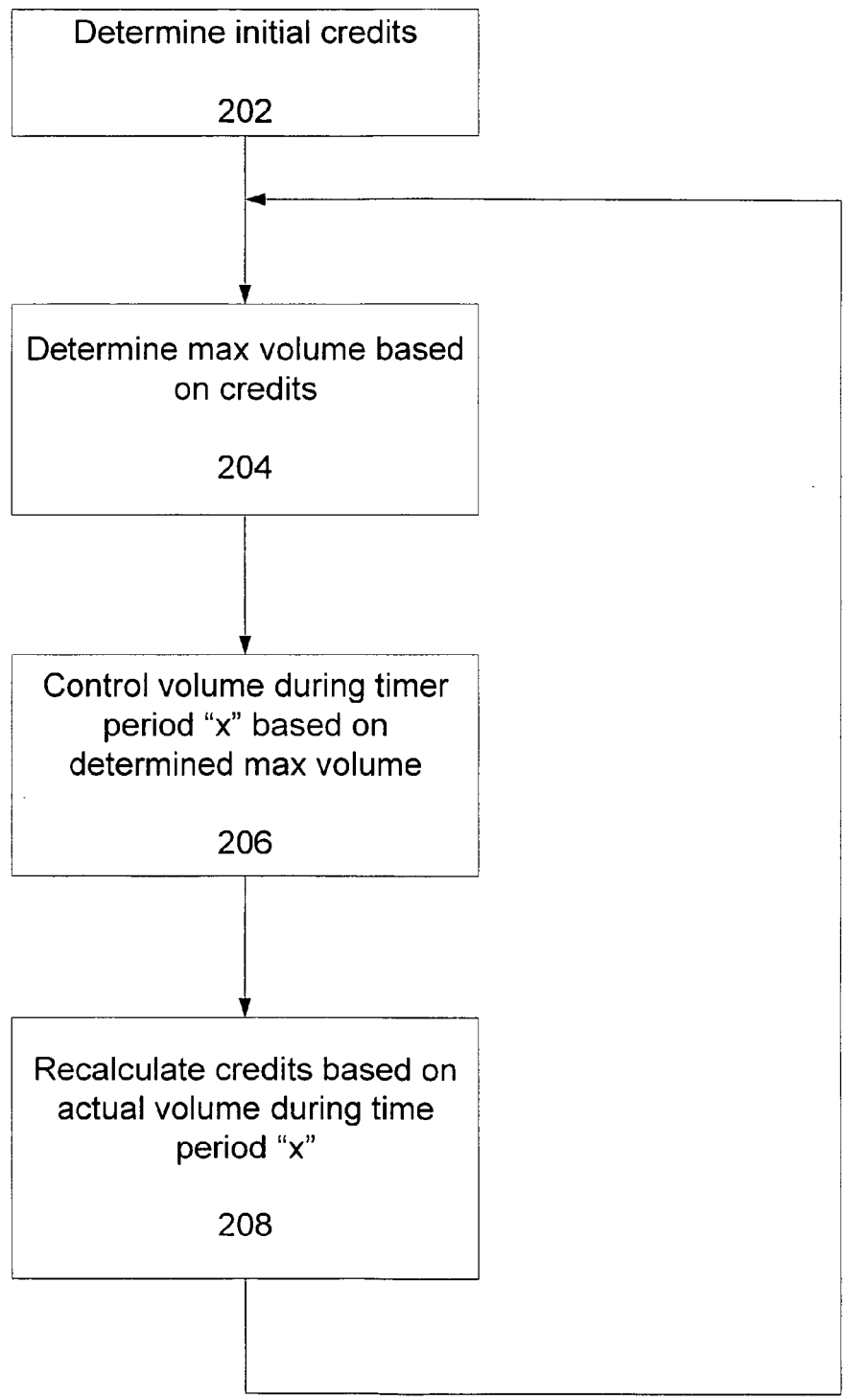
FIG. 2 is a flowchart illustrating processing in the portable media player for refining a maximum volume value based on an actual volume of media playback by the portable media player.

FIG. 2 is a flowchart illustrating an example of processing within the controller 106 of the portable media player 104 (FIG. 1) to accomplish enforcing the protection parameters. The controller may operate, for example, in a programmed manner based on software or firmware instructions. However, the controller is not limited, for example, to being a processor that executes instructions. In the FIG. 2 example, a "credit" scheme is employed. It is noted that this is an example, and other types of schemes may be employed. Turning now specifically to FIG. 2, at step 202, an initial number of credits is determined based on the protection parameters indicated or provided by the host application 102.

At step 204, a maximum allowed volume parameter, indicative of a maximum volume allowed for the next timer period "x" is determined based on the determined credits. In one particular example, the maximum allowed volume is determined based on the determined credits with reference to a profile such as profiles provided by the California Occupational Safety and Health Administration (Cal-OSHA). See, for example, Cal-OSHA Regulations—Control of Noise Exposures, in the California Code of Regulations, Title 8, Section 5096-5100 Article 105 and, see also, Permissible Noise Exposure—Table N-1 of the just-referenced regulation. It is noted that the profiles promulgated by Cal-OSHA appear to be rudimentary (e.g., do not deal in a sophisticated way with varying exposure over time and do not deal account for "recovery"). Thus, in some examples, more sophisticated profiles are employed.

At step 206, during the time period "x", the actual volume is controlled based on the determined maximum volume for the time period "x." Details according to particular examples are discussed later.

At step 208, the credits are recalculated based on the actual volume during the timer period "x." For example, if the user of the portable media player set the desired volume to be less than the determined maximum volume (or, perhaps, less than some other volume that is less than the determined maximum volume), then this may have allowed the user's hearing some "recovery" such that credits can be granted. That is, the credits may be usable to increase the determined maximum volume (as determined at step 204) for a future time period "x." After the credits are recalculated, then processing returns to step 204 for the next time period "x."

We now discuss, with reference to FIGS. 3 and 4, how step 204 processing may be affected by factors other than those purely within the profiles. FIG. 3 is an example of compensation factors that are utilized for various types of headphones. That is, the compensation factors may be factors that indicate (and, thus, are used as parameters to the formulas) how the formula may be modified for a particular headphone such that the formula more accurately reflects reality. For example, for a particular volume of sound output, one headphone may have characteristics versus characteristics of another headphone such that the first headphone does not have as deleterious effect on hearing as does the second headphone, even at the same particular volume of sound output. In various examples, compensation factors are provided for general types of headphones (e.g., earbud, over the ear, etc.) and, in other examples, the compensation factors are more specific, provided for various models of headphones.

FIG. 4 illustrates another example of compensation factor. In particular, FIG. 4 illustrates providing a compensation factor that characterizes the media that is being played. In one example, the characteristic is a characteristic (or is based on a characteristic) that has been determined by a Soundcheck feature of iTunes, indicating an approximate audio level of the song.

We now discuss details of an example of controlling the volume during time period "x" based on the determined maximum volume. In one example, the determined maximum volume is treated as a threshold. Thus, if the user of the portable media player sets the volume to a desired volume that is greater than the determined maximum volume for the time period "x," then the actual playback volume is set to the determined maximum volume. On the other hand, if the user of the portable media player sets the volume to a desired volume that is less than the determined maximum volume for the timer period "x," then the actual playback volume is set to the desired volume.

In another example, the indication of the determined maximum volume parameter is used in step 206 as a scale factor, such that the actual volume of audio output is the desired volume, scaled down by the scale factor.

In addition to lowering of the volume in step 206 leading to additional credits in step 208, a complete cessation of playing the media player should also lead to additional credits upon restarting of playing. Thus, in one example, when audio output is stopped, the time of cessation is stored such that, upon restarting of playing, the time between cessation and restarting can be treated as a "quiet" time during which recovery has taken place and for which credits should be added.

In other examples, at step 204, the determined maximum volume may be either zero or "indeterminate" (i.e., whatever volume the user desires). In these examples, then, the processing at step 206 operates to control the volume only when the determine maximum volume is zero—shutting down the audio output of the media player. At step 208, as part of the recalculating step, a user interface function may be provided to give the user of the portable media player an indication of how many credits remain. This indication may be, for example, an indication of how long output will be allowed at the current actual volume, based on the remaining credits. The indication may be a simple binary indication (such as flashing when only a threshold amount of time remains).

In some examples, causing the indication of the protection parameters is secure such that, for example, a parent could securely set the protection parameters for a child user of the portable media player. In one example, the host software 102 is used to create a tamperproof (or tamper-resistant) configuration file as described, for example, in U.S. patent application Ser. No. 11/191,133, entitled CONFIGURATION OF A COMPUTING DEVICE IN A SECURE MANNER, filed on Jul. 26, 2005 (the disclosure of which is incorporated herein in its entirety).

Furthermore, the discussion thus far has been in the context of a portable media player. However, in some examples, the concepts discussed herein are also applicable to audio devices such as, for example, cellular phones. With some audio devices, the audio playback characteristics can not (or, at least, cannot primarily) be determined in advance. For example, while playback characteristics of a song can be determined in advance (as illustrated by FIG. 4, for example), the levels of a voice speaking over a cellular phone connection typically cannot be determined in advance. Thus, in such situations, recalculating the credits (or otherwise adjusting how volume is to be controlled) may be more complicated, since more sophisticated monitoring of actual volume may be required.

While this invention has been described in terms of several embodiments, there are alterations, permutations, and equivalents, which fall within the scope of this invention. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. A method for dynamically changing a maximum allowed output volume of a portable media device, comprising:
    receiving an input of a hearing protection profile;
    determining a maximum allowed output volume based on the hearing protection profile, wherein the hearing protection profile accounts for a hearing recovery period, the hearing recovery period being when an actual output volume of an audio output is less than the maximum allowed output volume for a time period;
    receiving an input of a desired output volume of the audio output;
    controlling the actual output volume of the audio output for the time period, wherein controlling comprises setting the actual output volume:
        at the desired output volume when the desired output volume is less than the maximum allowed output volume, or at the maximum allowed output volume when the desired output volume is at or above the maximum allowed output volume; and increasing the maximum allowed output volume based on the hearing recovery period accounted for by the hearing protection profile, without adjusting the actual output volume, in response to the desired output volume being less than the maximum allowed output volume during the time period.

2. The method of claim 1, wherein the hearing protection profile is stored on a host computer with which the portable media device synchronizes.

3. The method of claim 1, wherein the hearing protection profile is based on an age of a user.

4. The method of claim 1, wherein the hearing protection profile is pre-stored on the portable media device.

5. The method of claim 1, further comprising adjusting the hearing protection profile based on a characteristic of a headphone used with the portable media device.

6. The method of claim 1, further comprising displaying an indication of a number of credits determined with reference to the hearing protection profile.

7. The method of claim 6, wherein the display on the portable media device of the number of credits is an indication of a remaining allowable playback time at the actual output volume based on the hearing protection profile.

8. A portable media device comprising:
a memory storing a plurality of media files; and
an audio output controller for controlling playback of the plurality of media files by an audio output, the audio output controller configured to:
  determine a maximum allowed output volume based on a hearing protection profile, wherein the hearing protection profile accounts for a hearing recovery period, the hearing recovery period being when an actual output volume of the audio output is less than the maximum allowed output volume for a time period,
  receive an input of a desired output volume of the audio output,
  control the actual output volume of the audio output for the time period, wherein controlling comprises setting the actual output volume:
    at the desired output volume when the desired output volume is less than the maximum allowed output volume, or
    at the maximum allowed output volume when the desired output volume is at or above the maximum allowed output volume, and
  increasing the maximum allowed output volume based on the hearing recovery period accounted for by the hearing protection profile, without adjusting the actual output volume, in response to the desired output volume being less than the maximum allowed output volume during the time period.

9. The portable media device of claim 8, wherein the audio output controller is further configured to:
monitor the actual output volume over a fixed period of time;
adjust the maximum allowed output volume based on the actual output volume over the fixed period of time without adjusting the actual output volume; and
play audio output of one or more of the media files below the adjusted maximum allowed output volume that is based on the actual output volume over the fixed period of time.

10. The portable media device of claim 9, wherein the media device further comprises an interface that connects to a host computer.

11. The portable media device of claim 8, wherein the audio output controller is connected to a speaker.

12. The portable media device of claim 8, wherein the audio output controller is connected to a headphone jack.

13. The portable media device of claim 8, further comprising a user interface indicating a remaining allowable playback time at the actual output volume based on the hearing protection profile.

14. A cellular phone comprising:
a memory;
an ear speaker;
a media playing component configured to play media files stored in the memory;
a voice microphone; and
an audio output controller coupled to the ear speaker and the memory and configured to:
  determine a cumulative effect of an actual output volume of the ear speaker on hearing during a time period before playing the media file;
  determine a maximum allowed output volume based on a hearing protection profile stored in the memory, an audio level, and a duration of the media file, wherein the hearing protection profile accounts for the cumulative effect and a hearing recovery period, the hearing recovery period being when the actual output volume of the ear speaker is less than the maximum allowed output volume while playing the media file;
  control the actual output volume of the ear speaker while playing the media file, wherein controlling comprises setting the actual output volume at or below the maximum allowed output volume; and
  increasing the maximum allowed output volume based on the hearing recovery period accounted for by the hearing protection profile, without adjusting the actual output volume, in response to the actual output volume being less than the maximum allowed output volume while playing the media file.

15. The cellular phone of claim 14, wherein the audio output controller is further configured to:
monitor the actual output volume of the ear speaker from cellular phone calls and media files played via the media playing component before playing the media file.

16. The cellular phone of claim 14, further comprising a user interface to indicate a remaining allowable playback time at the actual output volume based on the hearing protection profile.

17. The cellular phone of claim 16, further comprising:
a display to display the user interface, wherein the user interface is further configured to indicate the maximum allowed output volume for the media file.

* * * * *